United States Patent
Kaufmann et al.

(10) Patent No.: US 10,476,281 B2
(45) Date of Patent: Nov. 12, 2019

(54) REDOX FLOW BATTERY SYSTEM

(71) Applicant: TRUMPF Huettinger GmbH + Co. KG, Freiburg (DE)

(72) Inventors: Jens Kaufmann, Kirchzarten (DE); Thomas Lueth, Freiburg (DE)

(73) Assignee: TRUMPF Huettinger GmbH + Co. KG, Freiburg (DE)

( * ) Notice: Subject to any disclaimer, the term of this patent is extended or adjusted under 35 U.S.C. 154(b) by 10 days.

(21) Appl. No.: 15/842,649

(22) Filed: Dec. 14, 2017

(65) Prior Publication Data

US 2018/0109123 A1 Apr. 19, 2018

Related U.S. Application Data

(63) Continuation of application No. PCT/EP2016/063722, filed on Jun. 15, 2016.

(30) Foreign Application Priority Data

Jun. 15, 2015 (DE) .................. 10 2015 210 920

(51) Int. Cl.
*H02J 7/00* (2006.01)
*G01R 31/3842* (2019.01)
(Continued)

(52) U.S. Cl.
CPC ........ *H02J 7/0026* (2013.01); *G01R 31/3842* (2019.01); *H01M 8/188* (2013.01);
(Continued)

(58) Field of Classification Search
CPC .......... H02J 3/385; H02J 3/387; H02M 3/158; H02M 7/537
(Continued)

(56) References Cited

U.S. PATENT DOCUMENTS 5,659,237 A 8/1997 Divan et al.
7,746,669 B2 6/2010 Falk
(Continued)

FOREIGN PATENT DOCUMENTS

CN 102437628 5/2012
CN 103326437 9/2013
(Continued)

OTHER PUBLICATIONS

'de.wikipedia.org' [online]. "Gleichspannungswandler," dated on or before Jun. 30, 2015, <https://de. wikipedia.org/w/index.php?title=Gleichspannungswandler&oldid=142839634>. 9 pages (with English abstract).
(Continued)

*Primary Examiner* — Dharti H Patel
(74) *Attorney, Agent, or Firm* — Fish & Richardson P.C.

(57) ABSTRACT

The invention relates to a redox flow battery system, comprising a controller and a battery inverter, which is suitable for charging and/or discharging a battery. The battery inverter comprises: a) a plurality of battery connections, to each of which at least one battery can be connected; b) a first measuring device, which is suitable for measuring the voltage at a battery connection and which is connected to the controller with regard to signaling; c) a second measuring device, which is suitable for measuring the current at a battery connection and which is connected to the controller with regard to signaling; d) a grid connection, which can be connected to an alternating-current supply grid; and e) a plurality of DC/DC converters, of which at least one has a first bridge circuit directly connected to a battery connection.

17 Claims, 2 Drawing Sheets

(51) Int. Cl.
*H01M 8/18* (2006.01)
*H02H 7/125* (2006.01)
*H01M 10/46* (2006.01)
*H01M 16/00* (2006.01)
*H02H 7/12* (2006.01)
*H02M 3/335* (2006.01)
*H02M 1/32* (2007.01)
*H02M 3/158* (2006.01)
*H02M 1/00* (2006.01)

(52) U.S. Cl.
CPC ......... *H01M 10/46* (2013.01); *H01M 16/006* (2013.01); *H02H 7/1213* (2013.01); *H02H 7/1257* (2013.01); *H02J 7/0013* (2013.01); *H02M 3/33592* (2013.01); *H02M 1/32* (2013.01); *H02M 3/158* (2013.01); *H02M 2001/007* (2013.01); *Y02E 60/528* (2013.01)

(58) Field of Classification Search
USPC .......................................................... 361/18
See application file for complete search history.

(56) References Cited

U.S. PATENT DOCUMENTS

| | | | |
|---|---|---|---|
| 8,723,489 | B2 | 5/2014 | Parakulam et al. |
| 2002/0109467 | A1 | 8/2002 | Ito et al. |
| 2012/0091967 | A1* | 4/2012 | Kawamoto ............... H02J 3/32 |
| | | | 320/134 |
| 2012/0112545 | A1* | 5/2012 | Aiello ..................... H02M 7/49 |
| | | | 307/65 |
| 2014/0103860 | A1 | 4/2014 | Kominami et al. |
| 2015/0022140 | A1* | 1/2015 | Heishi ........................ H02J 7/34 |
| | | | 320/101 |

FOREIGN PATENT DOCUMENTS

| | | |
|---|---|---|
| CN | 104539187 | 4/2015 |
| DE | 102005023290 | 11/2006 |
| DE | 102013004262 | 9/2014 |
| EP | 1020973 | 7/2000 |
| JP | 2007-137093 | 6/2007 |
| JP | 2010-093952 | 4/2010 |
| JP | 2011-45240 | 3/2011 |
| KR | 10-2014-0080567 | 7/2014 |
| WO | WO 2016/202844 | 12/2016 |

OTHER PUBLICATIONS

'de.wikipedia.org' [online]. "Redox-Flow-Batterie," dated on or before Jun. 30, 2015. Retrieved from the Internet: URL <https://de.wikipedia.org/w/index.php?title=Redox-Flow-Batte 1 ie&oldid=139172719>. 7 pages (with English abstract).

International Search Report and Written Opinion in Application No. PCT/EP2016/063722, dated Sep. 23, 2016, 25 pages (with English Translation).

EP Office Action in European Appln. No. 16732993.7, dated May 20, 2019, 7 pages (with English translation).

* cited by examiner

REDOX FLOW BATTERY SYSTEM

CROSS REFERENCE TO RELATED APPLICATIONS

This application is a continuation of and claims priority under 35 U.S.C. § 120 from PCT Application No. PCT/EP2016/063722 filed on Jun. 15, 2016, which claims priority from German Application No. DE 10 2015 210 920.8, filed on Jun. 15, 2015. The entire contents of each of these priority applications are incorporated herein by reference.

TECHNICAL FIELD

The invention relates to a redox flow battery system comprising a controller and a battery inverter that is suitable for charging or discharging a battery. The invention further relates to a method for detecting a fault in a bridge circuit of a DC-to-DC converter of a redox flow battery system.

BACKGROUND

Redox flow batteries that use electrolyte combinations of V/V, Fe/Cr or Zn/Br, for example, are used increasingly as stationary energy stores. When integrated into a large system of energy generators and energy consumers, said batteries are used mainly for stabilization or can intercept generator peaks or load peaks.

A battery system of this type is described in U.S. Pat. No. 8,723,489 for example.

Batteries of this type are usually connected to power electronics for the purpose of charging and/or discharging. The power electronics may comprise an inverter. If there is a fault in the power electronics on the battery side, the battery drives a large short-circuit current into the power electronics, which leads to the destruction of said power electronics and can also ultimately lead to a fire.

SUMMARY

One object of the present invention is to provide a redox flow battery system by means of which the above-identified disadvantages can be prevented and additionally to provide a method for detecting a fault in a bridge circuit of a DC-to-DC converter of a redox flow battery system, by means of which the above-mentioned disadvantages can be prevented.

Described below is a redox flow battery system with a controller and a battery inverter that is suitable for charging and/or discharging a battery. The battery inverter includes: a plurality of battery terminals, to each of which at least one battery can be connected; a first measuring device which is suitable for measuring the voltage at a battery terminal and which is connected to the control unit by means of signals; a second measuring device which is suitable for measuring the current at a battery connection and which is connected to the control unit by means of signals; a mains connection which can be connected to an AC supply network; a plurality of DC-to-DC converters, at least one of which comprises a first bridge circuit that is directly connected to a battery terminal.

A battery may be a cell or cell network, e.g. a flow battery stack or a plurality of flow battery stacks of a flow battery. A flow battery stack may consist of a plurality of cells, for example, 20 or 40 cells. A battery may be formed as a stack consisting of a plurality of flow battery cells. In some arrangements, a fault in the battery inverter, in particular in the bridge circuit, can be detected by the first and second measuring device. In some examples with the bridge circuit arranged directly at the battery, the bridge circuit can be switched off. In particular, the current flow from a high-voltage side to the battery can be disconnected safely. This can result in an overall safe system.

The first bridge circuit may comprise a primary winding of a transformer. In some examples, a capacitor or an inductor may be in series connection with the primary winding. In some examples, a capacitor may be in series connection with the secondary winding of the transformer. A capacitor may improve the safety in the event of a short circuit of a switch of the bridge circuit at the battery, because it prevents a direct current. Said capacitor also can improve the efficiency of the entire arrangement, since it causes the switch of the bridge circuit to be switched on or off at a favorable point in time (zero voltage switching). It is particularly preferable if a capacitor can be arranged on each side of the transformer.

The secondary winding of the transformer may be a part of a second bridge circuit. In particular, the battery inverter may comprise a bridge circuit on the high-voltage side and a bridge circuit on the low-voltage, e.g., battery side. The transformer may allow a transformation to be carried out from the low-voltage side to the high-voltage side. For example, the transformation ratio may be 1:12.

In some implementations, a buck-boost converter is connected downstream of the second bridge circuit of the at least one DC-to-DC converter. In some examples, voltage at the output of the second bridge circuit, for example at the output side of the inverter, can be increased by the buck-boost converter.

The controller may be configured such that a fault in the first bridge circuit can be detected on the basis of the voltage and current that are measured by the first and second measuring devices. In some implementations, the bridge circuit can be switched off upon detection of a fault. The safety of the redox flow battery system can thus be increased and a fire can be prevented. For example, the entire system can be transferred into a safe condition. In particular, the gate drivers of the switches of a bridge circuit can be driven to switch the bridge circuit off. Depending on the dimensioning, the switches of the bridge circuit can carry a short circuit current for a short period of time, and further destruction and a fire can be prevented. In some implementations, fuses may be provided. However, in some circumstances fuses may react too slowly to protect the battery inverter. The arrangement according to the present disclosure therefore offers greater protection than a sole fuse.

The invention also relates to a method for detecting a fault in a bridge circuit of a DC-to-DC converter of a redox flow battery system. Current and voltage are monitored at a battery terminal and the bridge circuit that is connected to the battery terminal may be switched off when a predetermined event occurs. As a result of this measure, destruction of the battery inverter can be avoided and a fire can be prevented.

The current and/or voltage may be monitored to detect whether a threshold value is reached. For example, if a threshold value is reached, it may suggest that a fault has occurred in the bridge circuit, for example, a short circuit has occurred. In this case, a bridge circuit can be switched off quickly.

The current and/or the voltage may be monitored with regard to whether a predetermined pattern has occurred. The pattern may also change over time. In particular, the predetermined pattern may be determined in a self-learning manner. If, for example, the current curve and/or the voltage curve displays a specific pattern, and said pattern suggests that there is a fault, the bridge circuit can be switched off. In particular, characteristic curves that clearly indicate a fault (short circuit or interruption) can be stored. If a characteristic curve of this type is detected, the switches can be actuated accordingly and the system can be brought into a safe state. In some implementations with a plurality of DC-to-DC converters in a battery inverter, it is possible to switch off only the affected branch, i.e. only the branch in which a faulty DC-to-DC converter has been detected.

In some implementations, a fault can be detected based on detection of a voltage dip. For example, a voltage dip may occur in the battery voltage if a short circuit occurs at a first switch of a bridge circuit.

The measured current and/or voltage can be used to determine which of the transistors of the bridge circuit is faulty. The bridge circuit can thus be actuated selectively, in order to prevent further faults and unsafe states. Optionally, a controlled exchange can take place on the basis of the detection of which of the transistors of the bridge circuit is faulty. The redox flow battery system can be further operated at lower power by the functioning bridge circuit.

The bridge circuit can be switched off by switching off gate drivers that are allocated to transistors of the bridge circuit. A bridge circuit can thus be switched off particularly quickly.

Further features and advantages of the invention can be found in the following description of an embodiment of the invention, with reference to the figures, and in the claims. The individual features may each be implemented in isolation or together in any desired combination in a variant of the invention.

DESCRIPTION OF DRAWINGS

One or more embodiments are shown schematically in the drawings and are described in the following.

DETAILED DESCRIPTION

Figure 1:
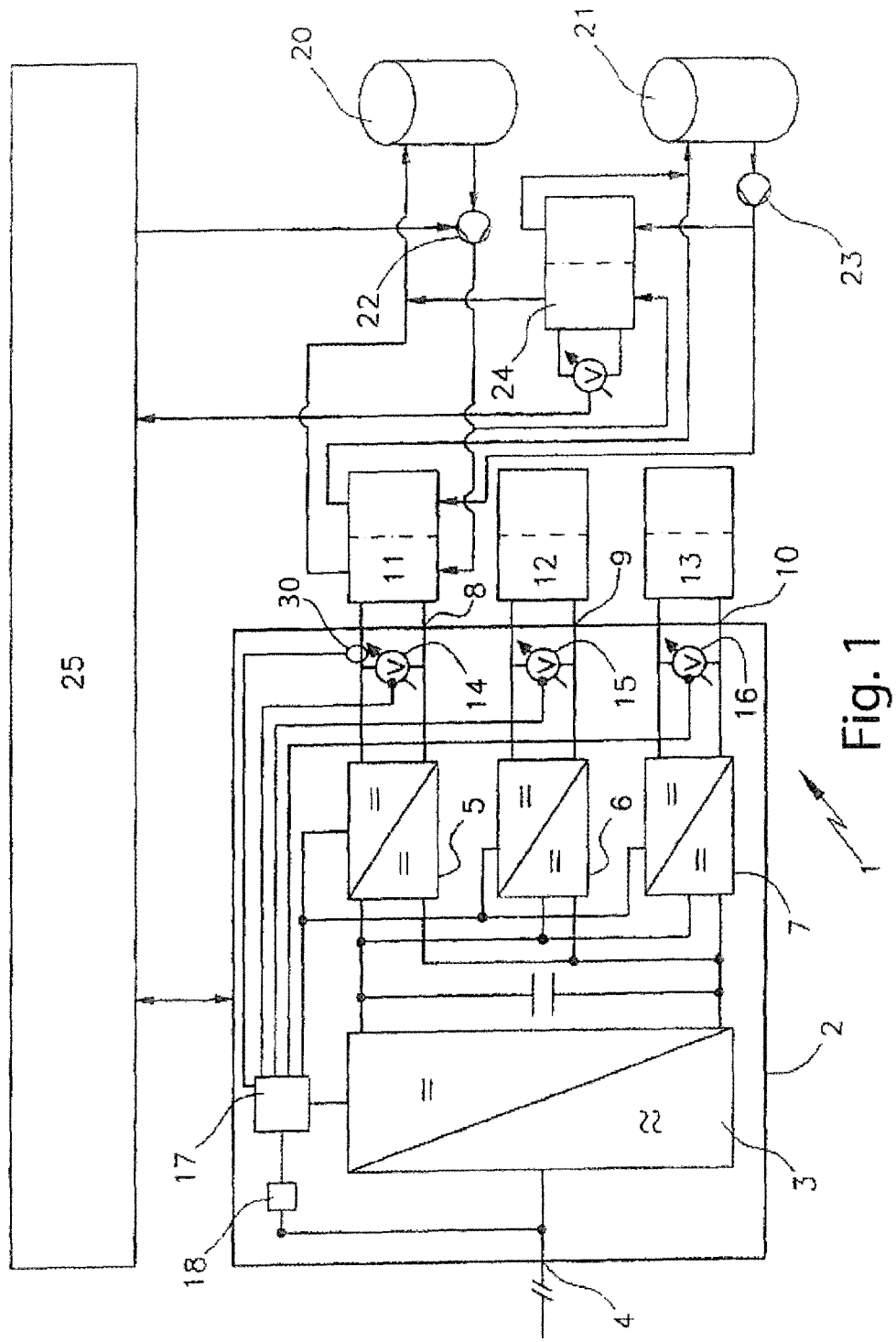
FIG. 1 is a perspective view of a redox flow battery system, according to an implementation of the disclosure.

FIG. 1 shows a redox flow battery system 1 comprising a bidirectional inverter 2. The bidirectional inverter 2 comprises an AC-to-DC converter 3 (which may also operate as a DC-to-AC inverter), which is connected to a mains connection 4 of the inverter 2. In the embodiment shown, three DC-to-DC converters 5 to 7 are connected to the AC-to-DC converter 3. The DC-to-DC converters 5 to 7 are each connected to a battery terminal 8 to 10 of the inverter 2. Batteries 11 to 13 are connected to respective battery terminals 8 to 10. The batteries 11 to 13 may in fact be formed as stacks consisting of a plurality of flow battery cells. First measuring devices 14 to 16 are arranged in each case at the battery terminals 8 to 10. By means of these measuring devices the voltage at the battery terminals 8 to 10 can be monitored and detected. The voltage at the batteries 11 to 13 can thus be monitored simultaneously. State of charge (in open-circuit operation) can also be ascertained. Said state of charge can be compared to the reference cell 24 and aging of the battery can be inferred. The first measuring devices 14 to 16 are connected to a controller 17 by means of signals. The controller 17 is furthermore connected to the AC-to-DC converter 3 and the DC-to-DC converters 5 to 7 by means of signals. The controller 17 is supplied with power by an auxiliary power supply 18. In this embodiment, the power supply 18 is connected to the mains connection 4.

Furthermore, each battery terminal 8, 9, 10 comprises a second measuring device 30 that measures the current at the battery terminal 8, 9, 10. A second measuring device 30 for the battery terminal 8 is shown in FIG. 1 merely by way of example. However, the battery terminals 9, 10 also comprise corresponding second measuring devices.

The redox flow battery system of FIG. 1 comprises electrolyte tanks 20, 21. Pumps 22, 23 can pump electrolytes from the electrolyte tanks 20, 21 to the batteries 11 to 13. A corresponding line system may be provided for this purpose. In the embodiment shown, only the line system by which the battery 11 is supplied is shown, in order to maintain clarity. Furthermore, a measuring cell 24 that can monitor the state of charge is shown.

The redox flow battery system 1 further comprises a primary controller 25 which can control not only the inverter 2 but also, for example, the pumps 22, 23. The primary controller 25 could also be arranged in the inverter 2. In particular, it could be arranged in the controller 17. Alternatively, the controller 17 may be integrated into the primary controller 25.

Figure 2:
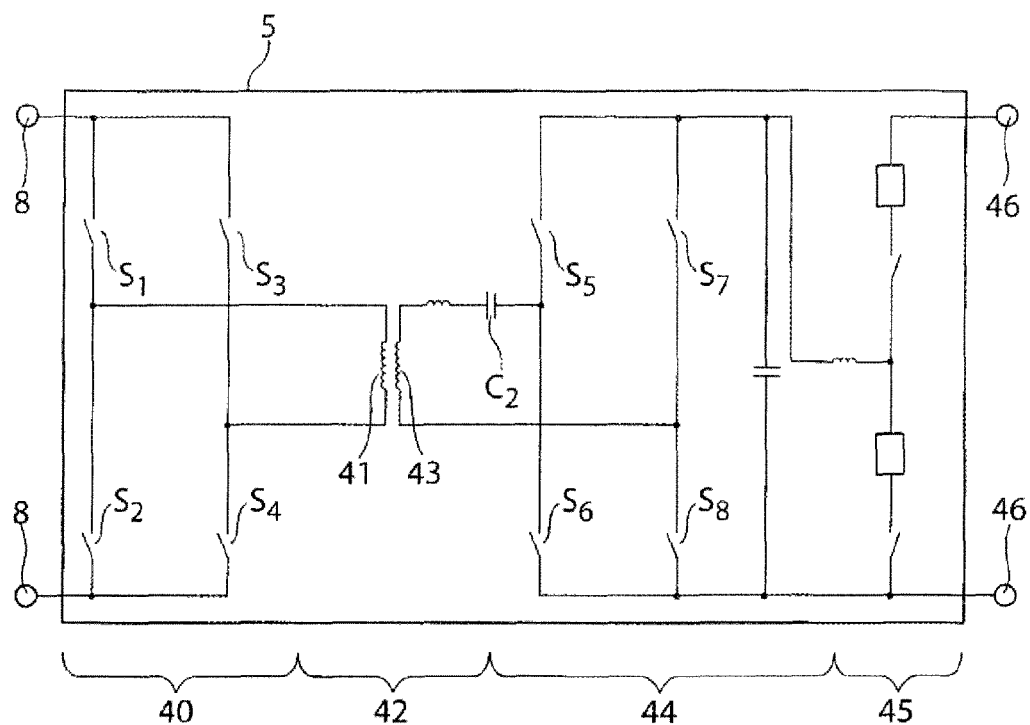
FIG. 2 is a schematic of a DC-to-DC converter, according to an implementation of the disclosure.

FIG. 2 shows an embodiment of the DC-to-DC converter (e.g., the DC-to-DC converters 5, 6, or 7). In the illustration in FIG. 2, the battery terminal 8 of the DC-to-DC converter 5 is shown on the left-hand side. A bridge circuit 40 on the low-voltage side is connected to the battery terminal 8. The bridge circuit comprises four switching elements S1, S2, S3 and S4, for example, formed by transistors. The bridge circuit 40 is thus intended to be directly connected to a battery 11. There are no additional component parts provided between the bridge circuit 40 and the battery 11. A fuse may optionally be provided between the bridge circuit 40 and the battery 11.

The primary winding 41 of a transformer 42 is a part of the bridge circuit 40. A capacitor C2 is in series connection with the secondary winding 43 of the transformer 42. The secondary winding 43 is a part of a second bridge circuit, namely a bridge circuit 44 on the high-voltage side. The bridge circuit 44 also comprises four switching elements S5 to S8. A bidirectional buck-boost converter 45 is provided at the output of the bridge circuit 44. The converter 45 may be connected to the AC-to-DC converter 3.

The AC voltage that is generated by the bridge circuit 40 can be stepped up by the transformer 42. Said voltage can in turn be converted into a DC voltage by the bridge circuit 44 with DC voltage higher than the DC voltage at the battery terminal 8. The DC voltage can be further adjusted by the buck-boost converter 45.

The controller 17 can detect when a fault occurs in the bridge circuit 40, in particular when there is a short circuit or an interruption in the bridge circuit 40. In particular, fault states of the individual switches S1 to S4 can be detected. If a fault is detected, the bridge circuit 40 can be switched off by accordingly driving drivers (not shown), in particular gate drivers, of the switches S1 to S4. A current flow from the high-voltage side at the terminal 46 to the low-voltage side at the battery terminal 8 can thus be prevented.

The same concept of fault monitoring and switching-off can be applied to the bridge circuit 44.

Figures 3, 4:
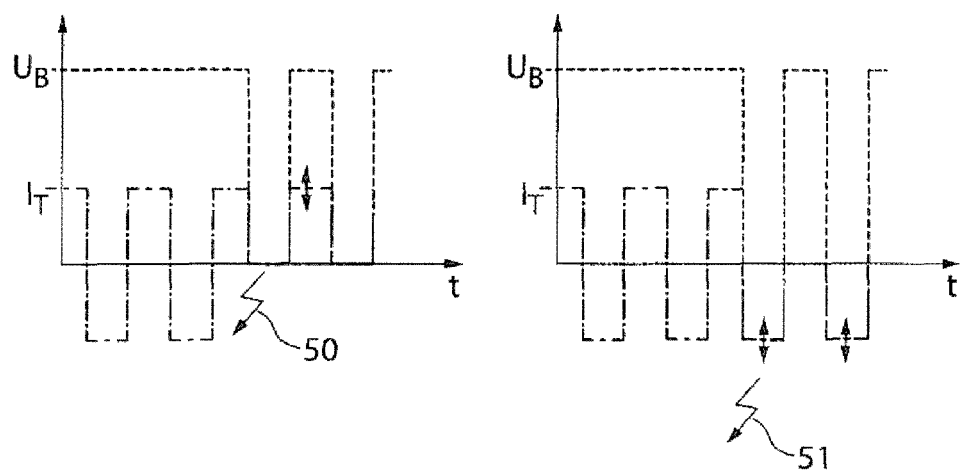
FIG. 3 is a schematic that shows characteristic voltage and current curves that suggest that a fault has occurred in a bridge circuit, according to an example of the disclosure.
FIG. 4 is a schematic that shows another characteristic current and voltage curves that suggest a fault in a bridge circuit, according to another example of the disclosure.

FIG. 3 shows a voltage curve of the battery voltage $U_B$ and a current curve $I_T$. For example, the voltage curve can be detected by the first measuring device 14, and the current curve can be detected by the second measuring device 30. There is a sag in the voltage $U_B$ at point 50. In addition, the current $I_T$ no longer reaches negative values. This pattern, i.e. a sag in the battery voltage $U_B$ and reduced amplitude of the current $I_T$, may suggest that a short circuit has occurred at switches S1 or S3. If a pattern of this type is detected, the bridge circuit 40 can be switched off.

FIG. 4 also shows voltage and current curves in the battery voltage $U_B$ and the current $I_T$, measured by the first and second measuring devices 14 and 30. A fault occurs again at point 51. A voltage sag in the battery voltage $U_B$ occurs in this case too. However, the current $I_T$ continues to reach negative values. This pattern suggests that a fault, in particular a short circuit, has occurred at switch S2 or S4. If a pattern of this type, i.e. a curve of this type of the battery voltage $U_B$ and the current $I_T$, is detected, the bridge circuit 40 can be switched off.

What is claimed is:

1. A redox flow battery system comprising:
   a controller; and
   a battery inverter that is suitable for at least one of charging and discharging one or more redox flow batteries, wherein the battery inverter comprises:
   one or more battery terminals for connecting the battery inverter to the one or more redox flow batteries,
   a voltage sensor responsive to voltage of at least a first battery terminal, the voltage sensor being in communication with the controller,
   a current sensor responsive to current at the first battery terminal, the current sensor being in communication with the controller,
   a mains connection connectable to an AC supply network, and
   a plurality of DC-to-DC converters, including a first DC-to-DC converter comprising a first bridge circuit directly connected to the first battery terminal,
   wherein the controller is configured to switch off the first bridge circuit when a predetermined event occurs.

2. The redox flow battery system of claim 1, further comprising a transformer having a primary winding and a secondary winding, wherein the primary winding is part of the first bridge circuit and the secondary winding is in series connection with a capacitor.

3. The redox flow battery system of claim 2, wherein the secondary winding is part of a second bridge circuit.

4. The redox flow battery system of claim 2, wherein the battery inverter comprises a high-voltage side with a second bridge circuit, and a low-voltage battery side with the first bridge circuit, such that the transformer is configured to carry out a transformation from the low-voltage battery side to the high-voltage side.

5. The redox flow battery system of claim 4, wherein at least one of the first and the second bridge circuits is switchable to an off mode to disconnect current flow from the high-voltage side to the one or more redox flow batteries.

6. The redox flow battery system of claim 3, wherein a buck-boost converter is connected downstream of the second bridge circuit of the plurality of DC-to-DC converters to increase voltage at an output of the second bridge circuit which is an output of the battery inverter.

7. The redox flow battery system of claim 1, wherein the controller is configured to detect a fault in the first bridge circuit based on voltage and current measured by respective ones of the voltage sensor and the current sensor, and to switch the first bridge circuit off upon detecting a fault.

8. The redox flow battery system of claim 4, wherein at least one of the first and the second bridge circuits has a plurality of switches with gate drivers configured to switch off respective bridge circuits and prevent a current flow from the high-voltage side to the low-voltage battery side of the battery inverter.

9. A method for detecting a fault in a battery inverter of a redox flow battery system, the method comprising:
   monitoring current and voltage at a battery terminal of the battery inverter, wherein the battery inverter is suitable for at least one of charging and discharging one or more redox flow batteries, and the battery inverter comprises:
   one or more battery terminals for connecting the battery inverter to the one or more redox flow batteries,
   a voltage sensor responsive to voltage of at least a first battery terminal, the voltage sensor being in communication with a controller of the redox flow battery system,
   a current sensor responsive to current at the first battery terminal, the current sensor being in communication with the controller,
   a mains connection connectable to an AC supply network, and
   a plurality of DC-to-DC converters, including a first DC-to-DC converter comprising a bridge circuit directly connected to the first battery terminal; and
   switching the bridge circuit off when a predetermined event occurs.

10. The method of claim 9, wherein at least one of the current and the voltage are monitored with regard to whether a threshold value is reached.

11. The method of claim 9, wherein at least one of the current and the voltage are monitored with regard to whether a predetermined pattern has occurred.

12. The method of claim 9, wherein the predetermined event occurs when a voltage dip is detected.

13. The method of claim 9, further comprising using at least one of the monitored current and the monitored voltage to determine a faulty transistor of the bridge circuit.

14. The method of claim 9, wherein the bridge circuit is switched off by switching off gate drivers associated with a plurality of transistors of the bridge circuit.

15. The system of claim 1, wherein the first bridge circuit is directly connected to both ports of the first battery terminal.

16. The method of claim 9, wherein the bridge circuit is directly connected to both ports of the first battery terminal.

17. The method of claim 12, wherein the voltage dip is indicative of a short circuit in the bridge circuit.

* * * * *